(12) United States Patent
Seyama et al.

(10) Patent No.: US 6,693,362 B2
(45) Date of Patent: Feb. 17, 2004

(54) MULTICHIP MODULE HAVING CHIPS MOUNTED ON UPPER AND UNDER SURFACES OF A THIN FILM CLOSING AN OPENING FORMED IN A RIGID SUBSTRATE

(75) Inventors: Kiyotaka Seyama, Kawasaki (JP); Hiroshi Yamada, Kawasaki (JP); Haruhiko Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/988,575

(22) Filed: Nov. 20, 2001

(65) Prior Publication Data

US 2002/0149098 A1 Oct. 17, 2002

(30) Foreign Application Priority Data

Apr. 13, 2001 (JP) .......................... 2001-116022

(51) Int. Cl.[7] .......................... H01L 23/48; H01L 23/52; H01L 29/40; H01L 23/34; H01L 21/44; H01L 21/48; H01L 21/50
(52) U.S. Cl. .......................... 257/777; 257/723; 438/107; 438/109
(58) Field of Search ................. 257/723, 777; 438/107, 109; 361/761

(56) References Cited

U.S. PATENT DOCUMENTS

| 4,744,008 A | 5/1988 | Black et al. | |
|---|---|---|---|
| 5,562,971 A | * 10/1996 | Tsuru et al. | 428/209 |
| 5,931,222 A | * 8/1999 | Toy et al. | 165/80.3 |
| 6,324,067 B1 | * 11/2001 | Nishiyama | 361/761 |

FOREIGN PATENT DOCUMENTS

| JP | 63-131561 | 6/1988 |
|---|---|---|
| JP | 2000-353765 | 12/2000 |

OTHER PUBLICATIONS

Graf, "Modern Dictionary of Electronics," 6th ed. 1997, p. 154, 989, 1033–1034.*

Harper, et al., "Electronic Packaging, Microelectronics, and Interconnection Dictionary," 1993, p. 156.*

* cited by examiner

Primary Examiner—Carl Whitehead, Jr.
Assistant Examiner—Nema Berezny
(74) Attorney, Agent, or Firm—Staas & Halsey LLP

(57) ABSTRACT

A multichip module is provided. The multichip module comprises a rigid substrate including a core material and having an opening, a thin film fixed on an upper surface of the rigid substrate so as to be electrically connected to the rigid substrate and to close the opening, a first chip mounted on the upper surface of the thin film, and a second chip mounted on the under surface of the thin film so as to be located in the opening of the rigid substrate. The rigid substrate and the thin film form a wiring substrate having a composite structure.

7 Claims, 15 Drawing Sheets

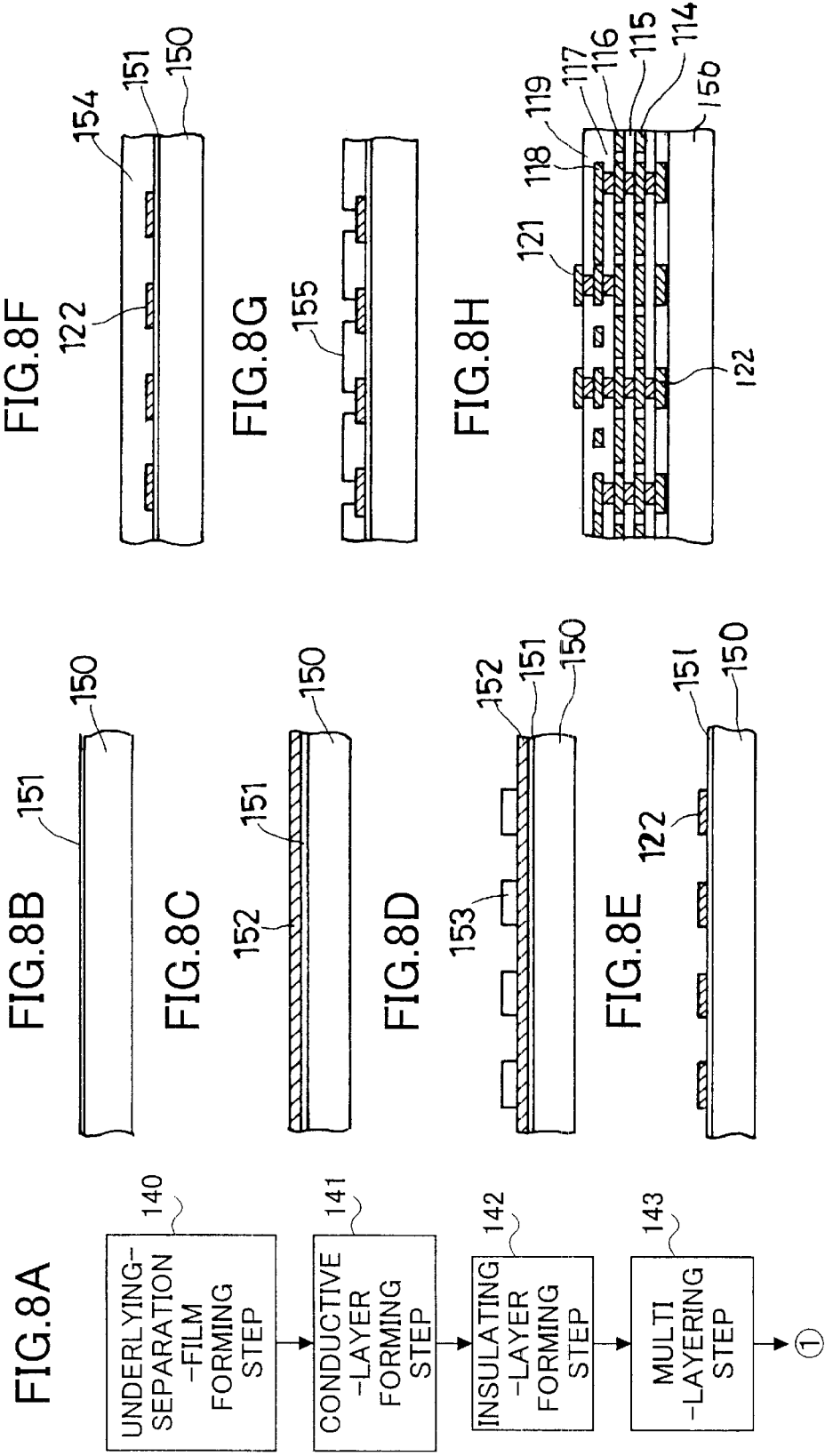

MULTICHIP MODULE HAVING CHIPS MOUNTED ON UPPER AND UNDER SURFACES OF A THIN FILM CLOSING AN OPENING FORMED IN A RIGID SUBSTRATE

BACKGROUND OF THE INVENTION

1. Field of the Invention

The present invention generally relates to a multichip module and, more particularly, to a multichip module having LSI chips mounted on a wiring substrate of a composite structure.

In regard to a multichip module having LSI chips mounted on a wiring substrate, there are such requirements that the LSI chips be densely mounted, have high operating frequencies, be mounted in an arrangement that is easy to repair, and have a good heat radiation property.

In addition, there is a trend that LSI chips will have a micronized pattern and have narrowly pitched electrodes in the future. Accordingly, a wiring substrate on which these LSI chips are mounted needs to have a structure that can accommodate these LSI chips.

2. Description of the Related Art

A conventional chip module 10 comprises an LSI-chip-mounting wiring substrate 11, and an LSI chip 20 mounted thereon, as shown in FIG. 1. The LSI-chip-mounting wiring substrate 11 comprises a rigid substrate 12 formed of a glass epoxy and having a core material therein, built-up layers 13 and 14 formed on the upper and under surfaces of the rigid substrate 12, bumps 15 formed on the undersurface of the built-up layer 14, and an LSI chip-mounting part 16 provided on the upper surface of the built-up layer 13. The LSI chip 20 is mounted on the LSI-chip-mounting part 16 in a flip-chip form. The chip module 10 is mounted on a motherboard 30.

Since the chip module 10 employs a buildup method, the manufacture of the LSI-chip-mounting wiring substrate 11 does not exhibit a good yield. Additionally, due to a relatively low degree of evenness of the surface of the rigid substrate 12, an L/S (line/space) of a wiring pattern of the LSI-chip-mounting part 16 is limited to approximately 25/25 μm not narrow enough to cope with electrodes of the LSI chip to be narrowly pitched.

Inventors of the present invention proposed a multichip module solving the above-mentioned problems. Japanese Laid-Open Patent Application No. 2000-353765 describes this multichip module. As shown in FIG. 2, this multichip module 40 comprises an LSI-chip-mounting wiring substrate 41, and LSI chips 45 and 46 mounted thereon in a flip-chip form. The multichip module 40 is mounted on the motherboard 30.

The LSI-chip-mounting wiring substrate 41 has a composite structure comprising a rigid substrate 42 formed of a glass epoxy and having a core material therein, and a flexible substrate 43 bonded on the upper surface of the rigid substrate 42. An LSI-chip-mounting part 44 is formed on the upper surface of the flexible substrate 43.

The flexible substrate 43 is manufactured by sputtering and etching on a surface of a glass board having a high degree of evenness, which are eventually removed from the glass board.

Since the LSI-chip-mounting wiring substrate 41 is manufactured by bonding the flexible substrate 43 manufactured independently of the rigid substrate 42 on the upper surface of the rigid substrate 42, the manufacture of the LSI-chip-mounting wiring substrate 41 exhibits an improved yield, compared with the chip module 10 employing the buildup method. Additionally, an L/S of a wiring pattern of the LSI-chip-mounting part 44 becomes smaller than approximately 25/25 μm, narrow enough to cope with electrodes of the LSI chip to be narrowly pitched.

In the multichip module 40, however, the LSI chips 45 and 46 can be mounted only on the upper surface of the LSI-chip-mounting wiring substrate 41; thus, it is difficult to mount the LSI chips densely enough.

SUMMARY OF THE INVENTION

It is a general object of the present invention to provide an improved and useful multichip module in which the above-mentioned problems are eliminated.

A more specific object of the present invention is to provide a multichip module which can have LSI chips mounted densely enough on a wiring substrate.

In order to achieve the above-mentioned objects, there is provided according to one aspect of the present invention a multichip module comprising:

a rigid substrate including a core material and having an opening;

a thin film fixed on an upper surface of the rigid substrate so as to be electrically connected to the rigid substrate and to close the opening, the thin film having an upper chip mounting part on an upper surface thereof and an under chip mounting part on an under surface thereof;

a first chip mounted on the upper chip mounting part; and a second chip mounted on the under chip mounting part so as to be located in the opening, wherein the rigid substrate and the thin film form a wiring substrate having a composite structure.

According to the present invention, the chips are mounted not only on the upper surface of the thin film but also on the under surface thereof. Thus, the chips are densely mounted on the wiring substrate.

The distance between the chip mounted on the upper surface of the thin film and the chip mounted on the under surface thereof becomes as extremely short as the thickness of the thin film. In a case where the upper and under chips are semiconductor chips, a delay of a signal transmitted between the upper and under semiconductor chips becomes so small that the delay can be ignored. This enables operating frequencies of the semiconductor chips to be increased. In another case where one of the chips is a semiconductor chip, and the other is a chip capacitor, inductance between the semiconductor chip and the chip capacitor becomes extremely small so as to make a full use of the chip capacitor; this enables elimination of high-frequency noises.

Additionally, in the multichip module according to the present invention, the thin film may comprise a first electrode pad formed on the upper chip mounting part, a second electrode pad formed on the under chip mounting part, and a via hole connecting the first electrode pad and the second electrode pad.

According to the present invention, bumps of the chip mounted on the upper chip mounting part of the thin film and bumps of the chip mounted on the under chip mounting part thereof are electrically connected to each other by way of the via hole formed in the thin film. This makes a delay of a signal transmitted therebetween so small that the delay can be ignored, and consequently, enables operating frequencies of the semiconductor chips to be increased. Thereby, the upper and under chips can function as one large-sized chip having functions of both the upper and under chips. Therefore, the cost of manufacturing the chips can be lowered while the performance of the chips is maintained.

Additionally, the multichip module according to the present invention may further comprise:

a lid joined to the upper surface of the rigid substrate so that the lid contacts and covers the first chip; and a sealing member covering the second chip located in the opening.

According to the present invention, the lid and the sealing member protect the chips. Also, the lid encourages heat radiation so as to effectively cool the chip.

Additionally, in the multichip module according to the present invention, the first chip may produce a larger amount of heat than the second chip.

According to the present invention, the chip mounted on the upper surface of the thin film can be effectively cooled.

In order to achieve the above-mentioned objects, there is also provided according to another aspect of the present invention a printed board unit comprising:

a printed board; and a multichip module mounted on the printed board via at least one bump, the multichip module including:

a rigid substrate including a core material and having an opening, the bump being formed on an under surface of the rigid substrate;

a thin film fixed on an upper surface of the rigid substrate so as to be electrically connected to the rigid substrate and to close the opening, the thin film having an upper chip mounting part on an upper surface thereof and an under chip mounting part on an under surface thereof;

a first chip mounted on the upper chip mounting part; and a second chip mounted on the under chip mounting part so as to be located in the opening, wherein the rigid substrate and the thin film form a wiring substrate having a composite structure.

According to the present invention, the printed board unit can include densely mounted chips.

In order to achieve the above-mentioned objects, there is also provided according to another aspect of the present invention a wiring substrate comprising:

a rigid substrate including a core material and having an opening; and a thin film fixed on an upper surface of the rigid substrate so as to be electrically connected to the rigid substrate and to close the opening, the thin film having an upper chip mounting part on an upper surface thereof and an under chip mounting part on an under surface thereof, wherein the rigid substrate and the thin film form a composite structure.

According to the present invention, since the opening is formed in the rigid substrate, and the thin film closes the opening, the chips can be mounted not only on the upper surface of the thin film but also on the under surface thereof.

Forming the chip mounting parts on the thin film can make an L/S smaller than forming the chip mounting parts on the rigid substrate. Thereby, a pitch between electrode pads becomes narrow so as to deal with narrowly pitched electrodes of LSI chips henceforth.

In order to achieve the above-mentioned objects, there is also provided according to another aspect of the present invention a method of manufacturing a wiring substrate having a composite structure composed of a rigid substrate including a core material and having an opening, and a thin film fixed on an upper surface of the rigid substrate so as to be electrically connected to the rigid substrate and to close the opening, the thin film having an upper chip mounting part on an upper surface thereof and an under chip mounting part on an under surface thereof, the method comprising the steps of:

preparing a stage having a raised portion corresponding to the opening;

setting the rigid substrate on the stage by inserting the raised portion into the opening;

placing the thin film on the rigid substrate and an upper surface of the raised portion so that the thin film covers the opening; and joining the thin film to the rigid substrate.

According to the present invention, the thin film is supported on the upper surface of the raised portion of the stage. This prevents the thin film from bending downward, even when the opening of the rigid substrate is large. Since, the thin film is supported horizontally, the manufacturing steps of the wiring substrate can be performed reliably.

Other objects, features and advantages of the present invention will become more apparent from the following detailed description when read in conjunction with the accompanying drawings.

BRIEF DESCRIPTION OF THE DRAWINGS

FIG. 8A to FIG. 8H show steps of manufacturing the thin film shown in FIG. 7A;

DETAILED DESCRIPTION OF THE PREFERRED EMBODIMENTS

A description will now be given, with reference to the drawings, of embodiments according to the present invention.

[Embodiment 1]

Figure 3:
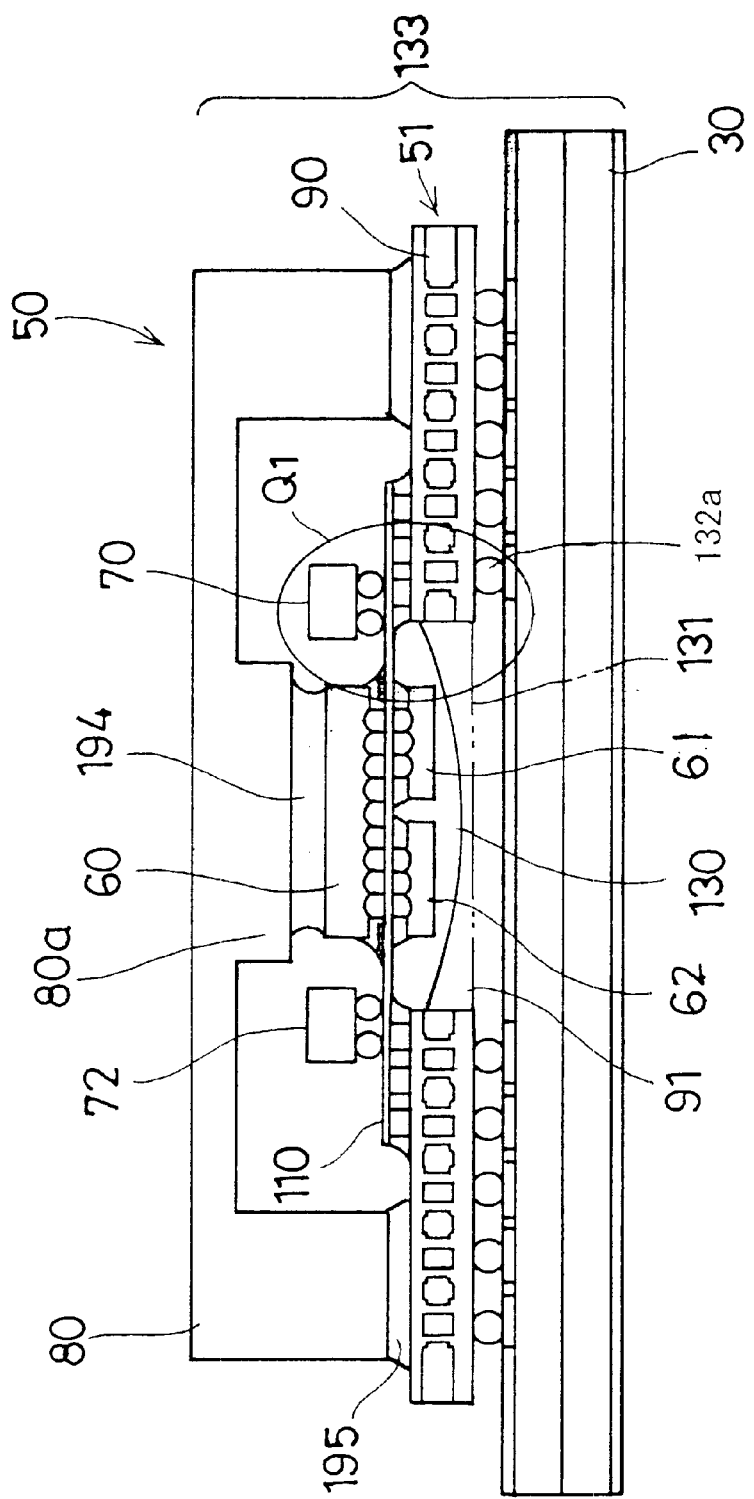
FIG. 3 is a cross-sectional view of a multichip module according to a first embodiment of the present invention.
Figure 4:
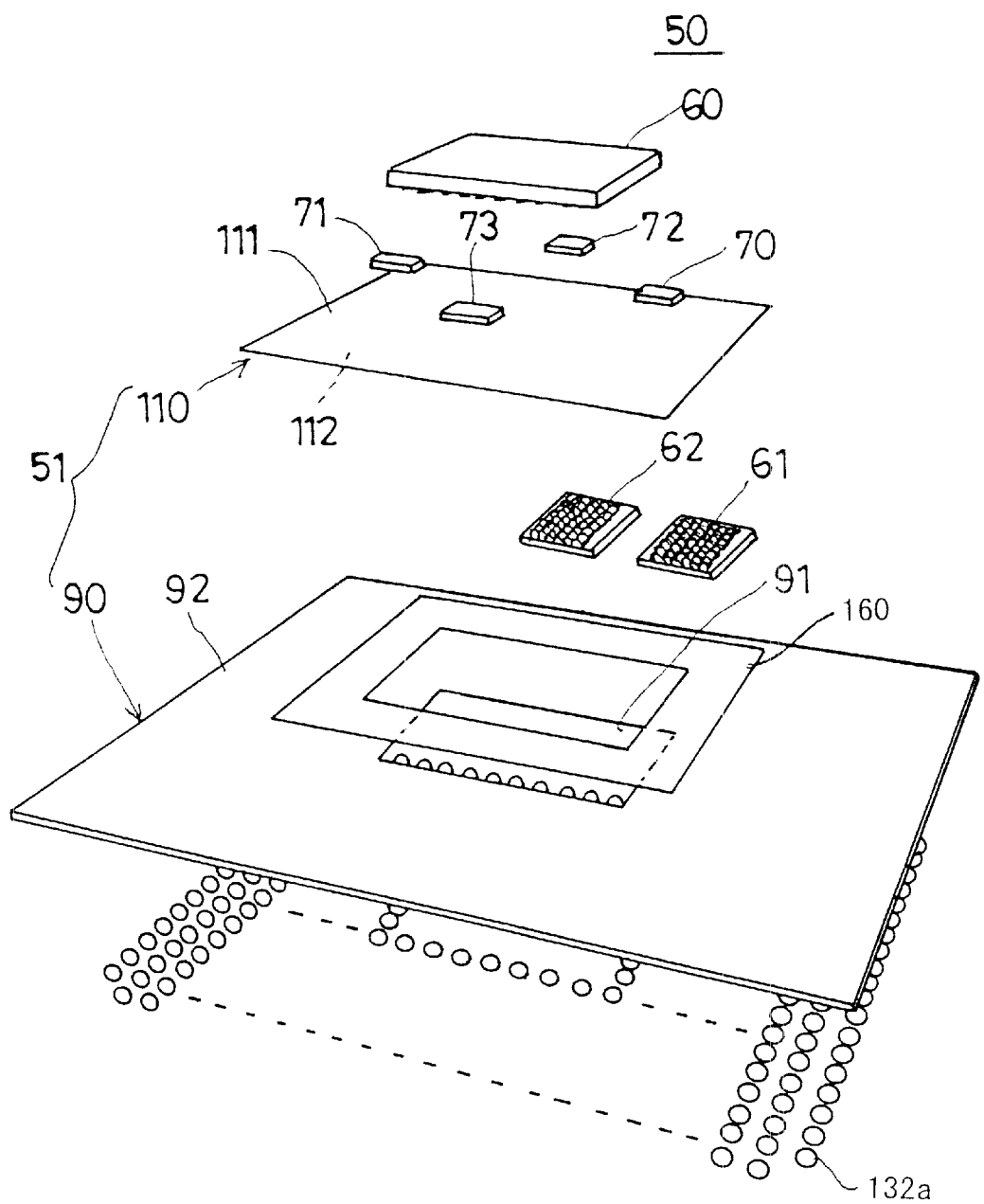
FIG. 4 is a perspective view of the multichip module shown in FIG. 3 as disassembled.
Figure 5:
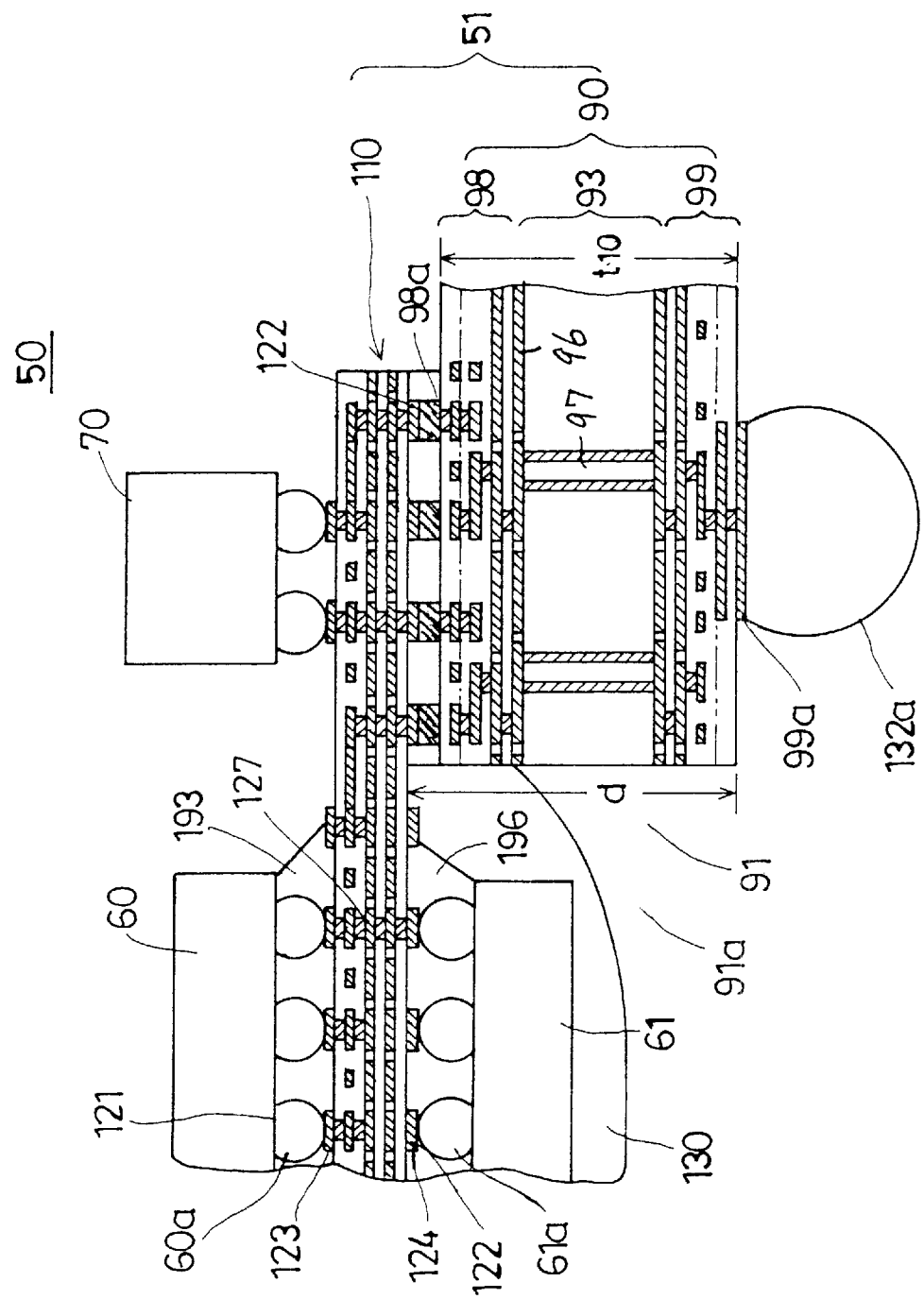
FIG. 5 is a magnified view of a part encircled by a circle Q1 in FIG. 3.

FIG. 3 is a cross-sectional view of a multichip module 50 according to a first embodiment of the present invention. In FIG. 3, the multichip module 50 is mounted on the motherboard 30. FIG. 4 is a perspective view of the multichip module 50 disassembled. In FIG. 4, a lid 80 is omitted from the view. FIG. 5 is a magnified view of a part encircled by a circle Q1 in FIG. 3.

First, a description will be given of a structure of the multichip module 50. As shown in FIG. 3 to FIG. 5, the multichip module 50 comprises a wiring substrate 51, LSI chips 60 to 62 and chip capacitors 70 to 73 mounted thereon, and the metallic lid 80 fixed on the upper surface of the wiring substrate 51.

The wiring substrate 51 comprises a rigid substrate 90 having an opening 91 formed at the center thereof, and a thin film 110 joined to an upper surface 92 of the rigid substrate 90. The opening 91 has a size corresponding to the LSI chips 61 and 62. The thin film 110 is a size larger than the opening 91 so as to close the opening 91. The LSI chip 60 and the chip capacitors 70 to 73 are mounted on an upper surface 111 of the thin film 110 in a flip-chip form. The LSI chips 61 and 62 are mounted in a flip-chip form on an under surface 112 of the thin film 110 closing the opening 91 so as to be contained in the opening 91.

The lid 80 is made of metal, being a size larger than the thin film 110, and is bonded to the upper surface 92 of the rigid substrate 90. The lid 80 covers the LSI chip 60 and the chip capacitors 70 to 73 mounted on the upper surface 111 of the thin film 110, and is bonded to the upper surface of the LSI chip 60.

The LSI chips 61 and 62 in the opening 91 are sealed with a sealing resin 130 formed of a synthetic resin potted therein. These LSI chips 61 and 62 may be sealed with a lid member 131 as indicated by a double dashed chain line in FIG. 3, in place of the sealing resin 130.

Figure 1:
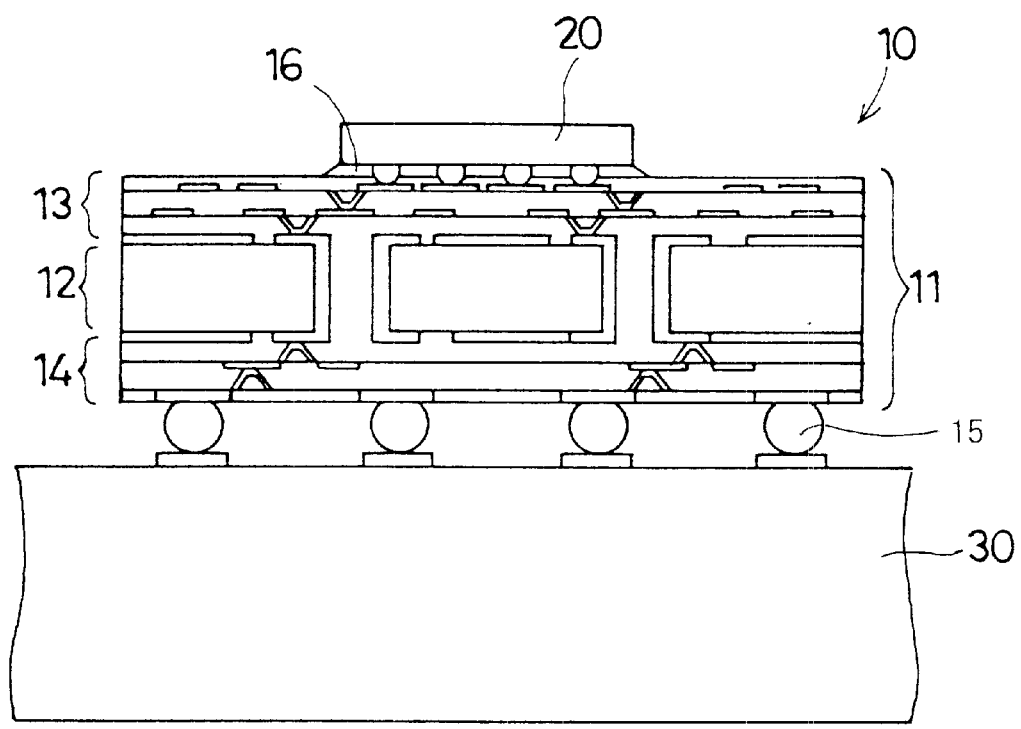
FIG. 1 shows an example of a conventional chip module.
Figure 2:
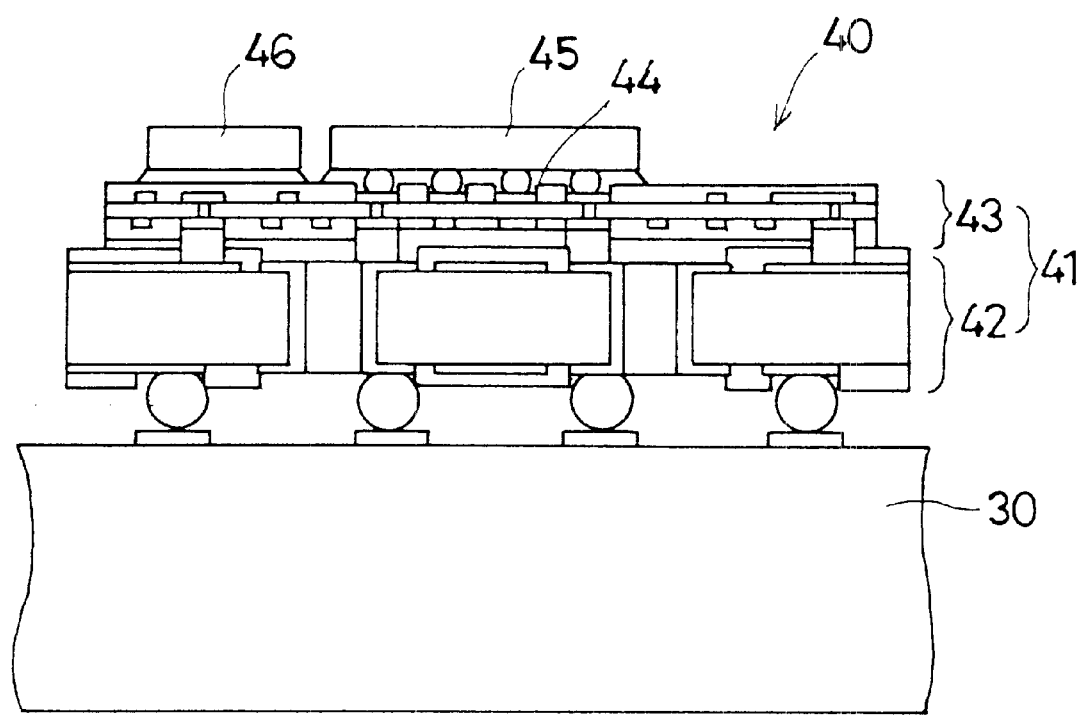
FIG. 2 shows another example of a conventional multichip module.

Forming the opening 91 in the rigid substrate 90 enables the LSI chips 61 and 62 to be mounted on the under surface 112 of the thin film 110. Thus, the multichip module 50 has the LSI chips 60 to 62 mounted on both the upper and under surfaces 111 and 112 of the thin film 110 of the wiring substrate 51. Therefore, the multichip module 50 has a larger number of the LSI chips than the multichip module 40 shown in FIG. 2. That is, the LSI chips (60 to 62) are mounted more densely on the wiring substrate 51.

Forming the opening 91 in the rigid substrate 90 of the wiring substrate 51 also enables the LSI chips 61 and 62 mounted on the under surface 112 of the thin film 110 to be exchanged easily.

In terms of heat production, the LSI chip 60 producing a large amount of heat is mounted on the upper surface 111 of the thin film 110. The LSI chips 61 and 62 producing a small amount of heat are mounted on the under surface 112 of the thin film 110. Besides, a reverse case is possible, in which an LSI chip producing a large amount of heat is mounted on the under surface 112 of the thin film 110, and an LSI chip producing a small amount of heat is mounted on the upper surface 111 of the thin film 110.

The multichip module 50 is mounted on a printed board, i.e., the motherboard 30, by a BGA 132a. The motherboard 30 and the multichip module 50 mounted thereon form a motherboard unit (a printed board unit) 133.

When the motherboard unit 133 is in operation, heat generated by the LSI chip 60 mounted on the upper surface 111 of the thin film 110 of the multichip module 50 is conducted to the lid 80, is spread throughout the lid 80, and is emitted from the surface of the lid 80 into the air. Heat generated by the LSI chips 61 and 62 on the under surface 112 of the thin film 110 is conducted to the lid 80 via the LSI chip 60, is spread throughout the lid 80, and is emitted from the surface of the lid 80 into the air. Thus, the multichip module 50 is effectively cooled.

Next, a description will be given of the elements composing the multichip module 50.

First, a description will be given of the wiring substrate 51.

The wiring substrate 51 has a composite structure comprising the rigid substrate 90 and the thin film 110 bonded to the upper surface 92 of the rigid substrate 90. The rigid substrate 90 and the thin film 110 are manufactured separately.

The rigid substrate 90 comprises a multilayered substrate 93 and built-up layers 98 and 99 formed on the upper and under surfaces thereof, as shown in FIG. 5.

Figure 6A:
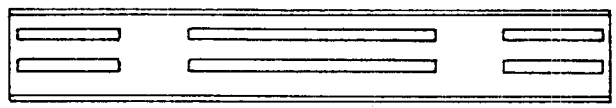
FIG. 6A to FIG. 6E show steps of manufacturing a rigid substrate shown in FIG. 3.
Figure 6B:
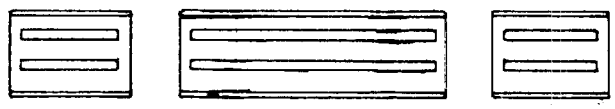
Figure 6C:
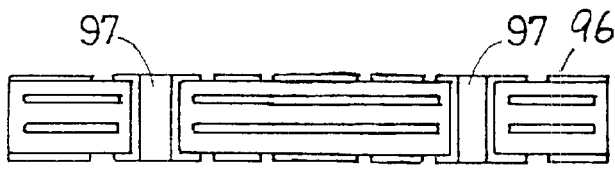
Figure 6D:
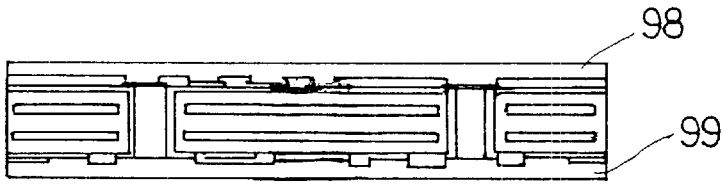
Figure 6E:
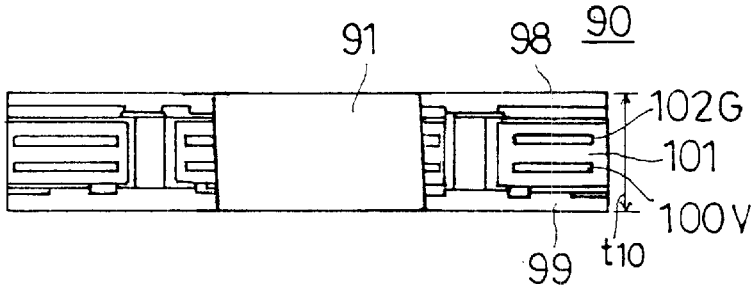

This rigid substrate 90 is manufactured as shown in FIG. 6A to FIG. 6E. FIG. 6A shows an original rigid form of the multilayered substrate 93 formed by an internal layer having a circuit pattern, and a semihard adhesive sheet (a prepreg), stacked alternately, and then heated and pressed. The multilayered substrate 93 forms a core material of the rigid substrate 90. Next, holes are formed in this multilayered substrate 93, as shown in FIG. 6B. Then, patterns 96 are formed on the multilayered substrate 93, and the holes are formed into via holes 97, as shown in FIG. 6C. Subsequently, the built-up layers 98 and 99 are formed on the upper and under surfaces of the multilayered substrate 93 by a buildup method, as shown in FIG. 6D. Finally, the opening 91 is formed in the multilayered substrate 93 by press working, as shown in FIG. 6E. The rigid substrate 90 shown in FIG. 3 and FIG. 4 is manufactured by the above-mentioned steps.

The rigid substrate 90 manufactured as above has an inner structure in which a power-supply layer 100V, an insulating layer 101, and a ground layer 102G are laminated.

Figure 7A:
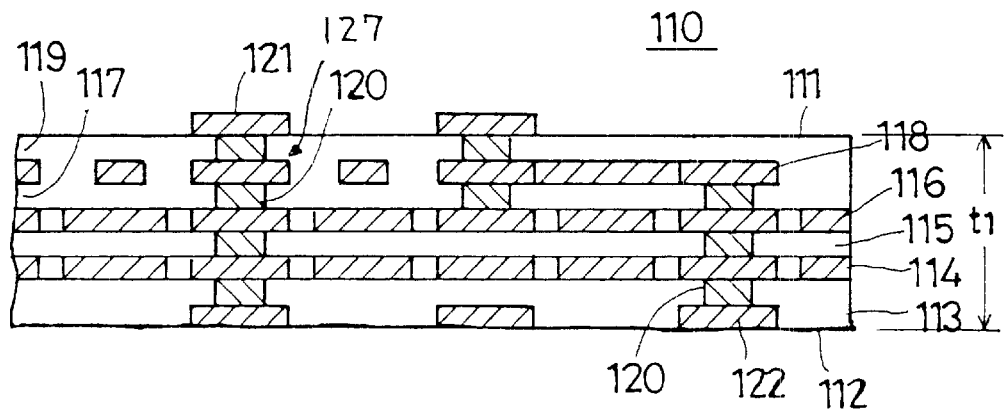
FIG. 7A is a magnified view of a part of a thin film shown in FIG. 3.
Figure 7B:
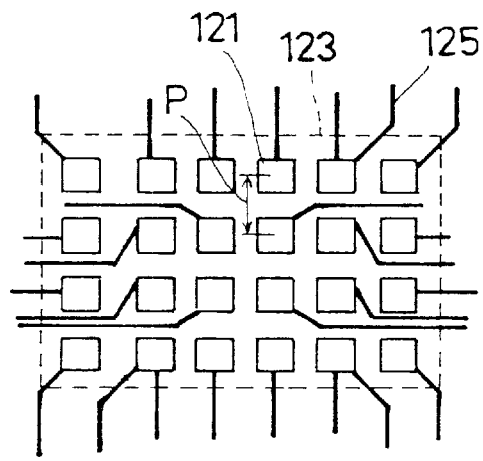
FIG. 7B is a perspective view of an LSI-chip-mounting part formed on the upper surface of the thin film shown in FIG. 5.
Figure 7C:
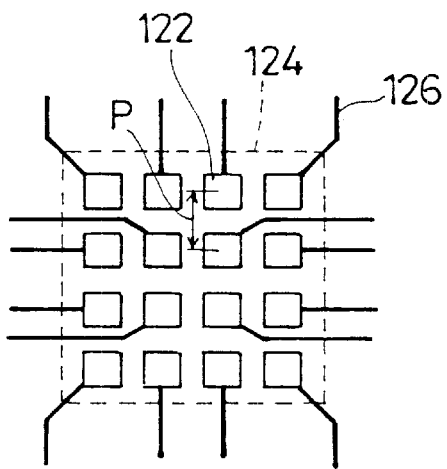
FIG. 7C is a perspective view of an LSI-chip-mounting part formed on the under surface of the thin film shown in FIG. 5.

FIG. 7A to FIG. 7C show the thin film 110. As shown in FIG. 7A, the thin film 110 comprises an insulating layer 113 made of polyimide, a power-supply layer 114 made of Cu, an insulating layer 115 made of polyimide, a ground layer 116 made of Cu, an insulating layer 117 made of polyimide, a signal layer 118 made of Cu, and an insulating layer 119 made of polyimide, in this order from the under surface 112. The thin film also comprises a plurality of via holes 120, a plurality of electrode pads 121 on the upper surface 111, and a plurality of electrode pads 122 on the under surface 112. The thin film 110 does not have a core material, and thus is flexible.

A LSI-chip-mounting part 123, as shown in FIG. 7B, is formed on the upper surface 111 of the thin film 110. A LSI-chip-mounting part 124, as shown in FIG. 7C, is formed on the under surface 112 of the thin film 110.

Wiring patterns 125 and 126 of the signal layer 118 of the thin film 110 can have such a small L/S of approximately 5/7.5 μm that a pitch P between the electrode pads 121 (122) is as narrow as approximately 150 μm. This is in accordance with increasingly narrowly pitched electrodes of LSI chips.

The thin film 110 has a thickness t1 of 50–60 μm.

Next, a description will be given, with reference to FIG. 8A to FIG. 9D, of a method of manufacturing the thin film 110.

Figure 9B:
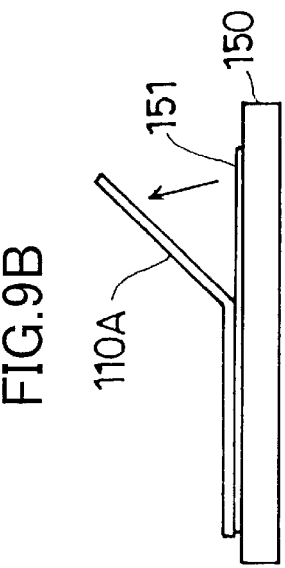
FIG. 9A to FIG. 9D show steps following the manufacturing steps shown in FIG. 8A to FIG. 8H.
Figure 9C:
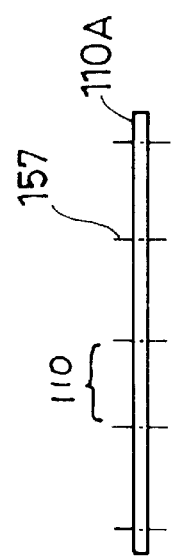
Figure 9D:
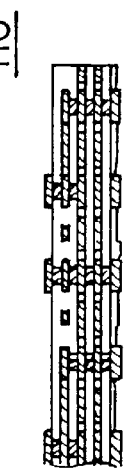
Figure 9A:
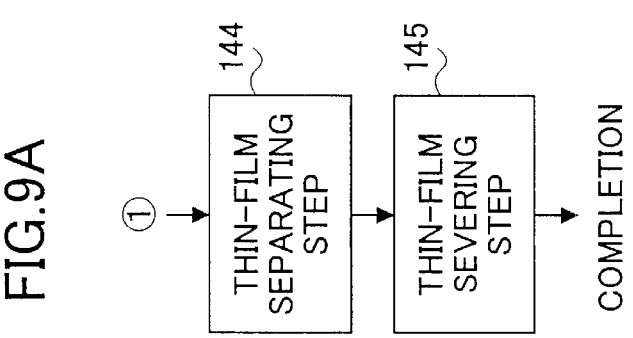

As shown in FIG. 8A and FIG. 9A, the thin film 110 is manufactured by an underlying-separation-film forming step 140, a conductive-layer forming step 141, an insulating-layer forming step 142, a multilayering step 143, a thin-film separating step 144, and a thin-film severing step 145.

The underlying-separation-film forming step 140:

As shown in FIG. 8B, an underlying separation film 151 is formed by sputtering chromium (Cr) on the upper surface of a glass board 150 having a high degree of evenness.

The conductive-layer forming step 141:

As shown in FIG. 8C, a conductive layer 152 is formed by sputtering Cu on the upper surface of the underlying separation film 151.

Then, as shown in FIG. 8D, an etching resist 153 is formed by applying a resist on the conductive layer 152, and exposing and developing the resist.

Subsequently, as shown in FIG. 8E, the electrode pads 122 are formed by etching the conductive layer 152, and thereafter removing the etching resist 153.

The insulating-layer forming step 142:

As shown in FIG. 8F, a photosensitive polyimide insulating layer 154 is formed by spin-coating with photosensitive polyimide so as to cover the electrode pads 122. Next, as shown in FIG. 8G, a polyimide insulating layer 155 is formed by exposing, developing and curing the photosensitive polyimide insulating layer 154.

The multilayering step 143:

As shown in FIG. 8H, a thin film 110A of a large size is formed by repeating the conductive-layer forming step and the insulating-layer forming step, in which the power-supply layer 114 made of Cu, the insulating layer 115 made of polyimide, the ground layer 116 made of Cu, the insulating layer 117 made of polyimide, the signal layer 118 made of cu, and the insulating layer 119 made of polyimide are stacked in this order.

The insulating layer 115, the insulating layer 117, and the insulating layer 119 are formed by spin-coating into a thickness equal to or smaller than 10 $\mu$m.

The thin-film separating step 144:

As shown in FIG. 9B, the thin film 110A is separated from the underlying separation film 151 by gripping and pulling up an edge of the thin film.

The thin-film severing step 145:

As shown in FIG. 9C, the separated thin film 110A is severed along lines 157 into a predetermined size by using a cutter. Thereby, a plurality of the thin films 110 shown in FIG. 9D and FIG. 4 are manufactured.

According to the above-described manufacturing steps, the wiring patterns 125 and 126 of the signal layer 118 of the thin film 110 can have such a small L/S of approximately 5/7.5 $\mu$m that the pitch P between the electrode pads 121 (122) is as narrow as approximately 150 $\mu$m.

Next, a description will be given, with reference to FIG. 10A to FIG. 10C, of a method of bonding the thin film 110 to the upper surface 92 of the rigid substrate 90.

Figure 10A:
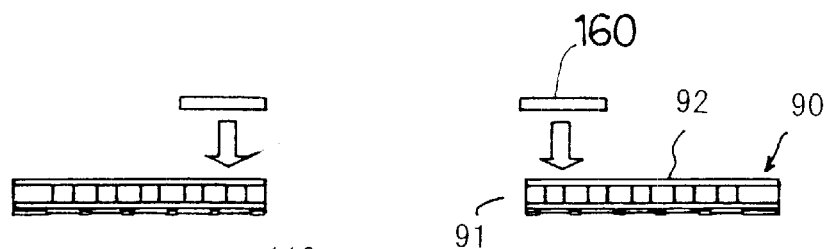
FIG. 10A to FIG. 10C show steps of manufacturing a wiring substrate shown in FIG. 3.

First, as shown in FIG. 10A, a bonding sheet 160 having a shape of a square frame (as viewed from above) is tacked around the opening 91.

Figure 10B:
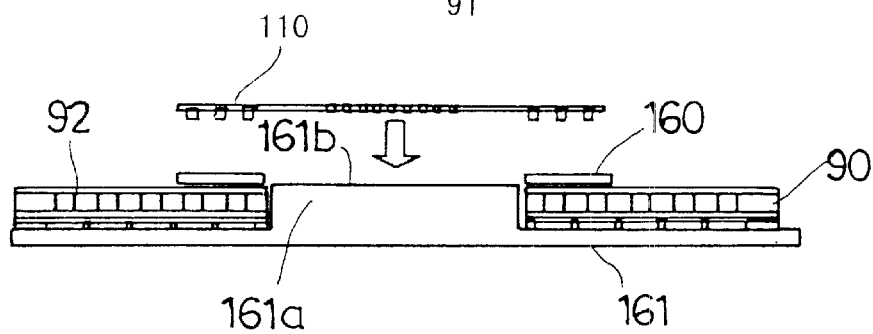
Figure 10C:
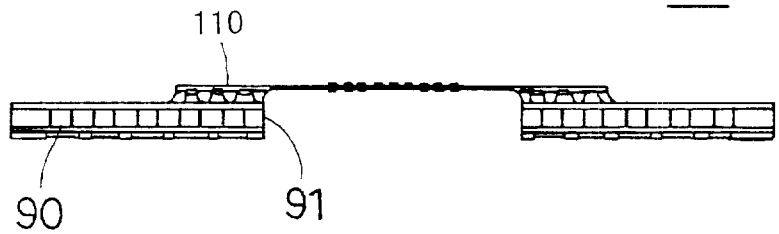

Next, as shown in FIG. 10B, a stage 161 having a raised portion 161a corresponding to the opening 91 of the rigid substrate 90 is prepared. Then, the rigid substrate 90 is set on the stage 161 by inserting the raised portion 161a into the opening 91. Subsequently, the thin film 110 is placed at a position on the bonding sheet 160 and the raised portion 161a so as to cover the opening 91, and is pressed and heated so as to be bonded to the upper surface 92 of the rigid substrate 90. Thereby, the wiring substrate 51 shown in FIG. 10C is manufactured.

It is noted that the raised portion 161a has a flat upper surface 161b positioned at the same height as the upper surface 92 of the rigid substrate 90 so as to support a part of the thin film 110 covering the opening 91. This prevents the thin film 110 from bending downward, even when the opening 91 has a large size. Thus, the thin film 110 is supported horizontally, and is surely bonded to the upper surface 92 of the rigid substrate 90 horizontally.

The wiring substrate 51 has a structure in which a peripheral portion of the thin film 110 is bonded to a portion on the upper surface 92 of the rigid substrate 90 around the opening 91 such that the thin film 110 covers the opening 91, and the electrode pads 122 of the thin film 110 are electrically connected with electrode pads 98a of the built-up layer 98 of the rigid substrate 90, as shown in FIG. 5.

Next, a description will be given, with reference to FIG. 11A to FIG. 12E, of a manufacture of the multichip module 50.

Figure 11A:
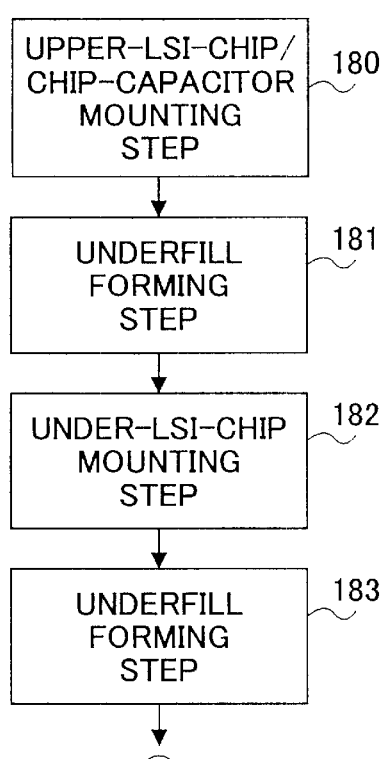
FIG. 11A to FIG. 11E show steps of manufacturing the multichip module shown in FIG. 3.
Figure 12A:
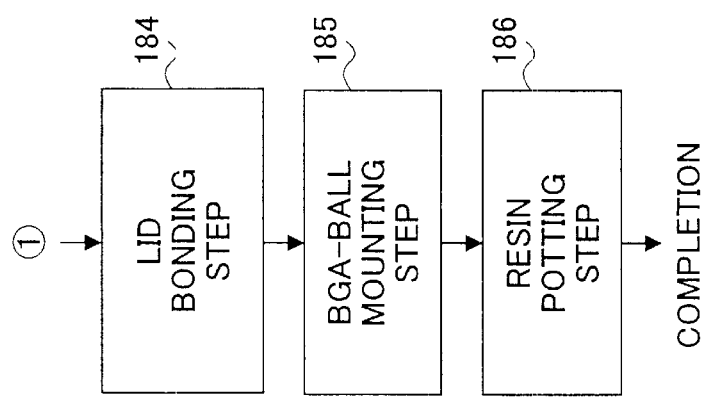
FIG. 12A to FIG. 12E show steps following the manufacturing steps shown in FIG. 11A to FIG. 11E.

As shown in FIG. 11A and FIG. 12A, the multichip module 50 is manufactured, based on the above-described wiring substrate 51, by an upper-LSI-chip/chip-capacitor mounting step 180, an underfill forming step 181, an under-LSI-chip mounting step 182, an underfill forming step 183, a lid bonding step 184, a BGA-ball mounting step 185, and a resin potting step 186.

Figure 11B:
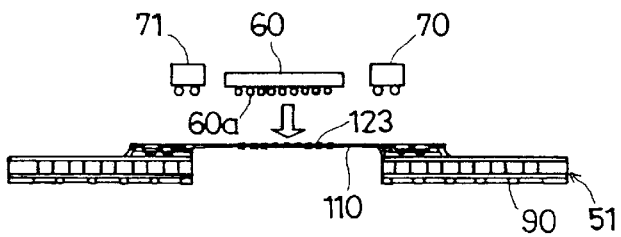
Figure 11C:
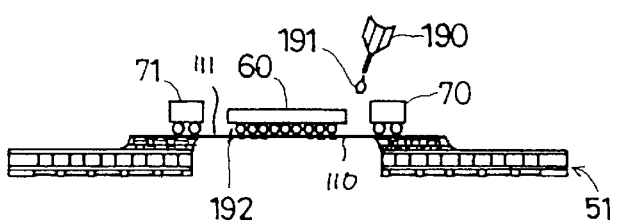

The upper-LSI-chip/chip-capacitor mounting step 180:

As shown in FIG. 11B and FIG. 11C, the wiring substrate 51 is set at a predetermined position, and the LSI chip 60 is mounted on the LSI-chip-mounting part 123 on the upper surface 111 of the thin film 110 such that bumps 60a formed on the undersurface of the LSI chip 60 oppose the corresponding electrode pads 121. The chip capacitors 70 to 73 are also mounted on predetermined positions on the upper surface 111 of the thin film 110.

Figure 11D:
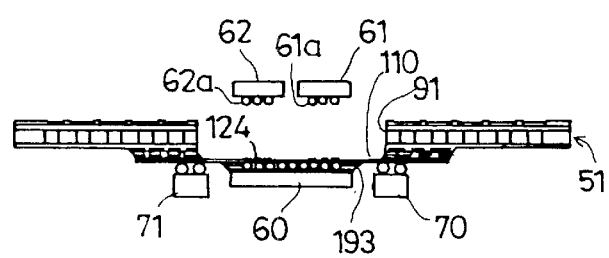

The underfill forming step 181:

As shown in FIG. 11C, an underfill resin 191 is supplied and infiltrated into a gap 192 between the undersurface of the LSI chip 60 and the upper surface 111 of the thin film 110 by using a dispenser 190 so as to form an underfill 193 therebetween, as shown in FIG. 11D (an overturned view).

Figure 11E:
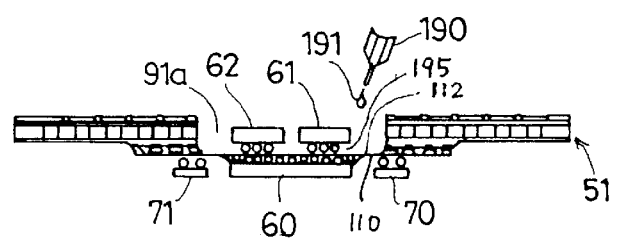

The under-LSI-chip mounting step 182:

As shown in FIG. 11D, the wiring substrate 51 is overturned (upside down), and the LSI chips 61 and 62 are mounted on the LSI-chip-mounting part 124 on the under surface 112 of the thin film 110 such that bumps 61a and 62a formed on the respective upper surfaces of the LSI chips 61 and 62 oppose the corresponding electrode pads 122. As shown in FIG. 11E, the LSI chips 61 and 62 are arranged side by side, and are contained in a space 91a formed by the opening 91 of the rigid substrate 90 and the thin film 110. The space 91a has a depth d corresponding to a thickness t10 of the rigid substrate 90, as shown in FIG. 5.

Figure 12B:
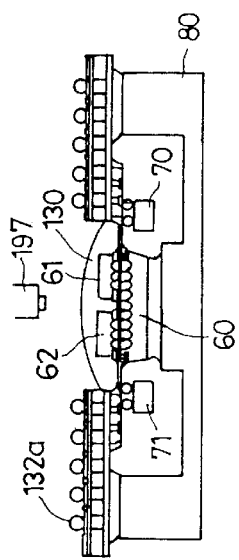

The underfill forming step 183:

As shown in FIG. 11E, the underfill resin 191 is supplied and infiltrated into a gap 195 between the upper surface of each of the LSI chips 61 and 62 and the under surface 112 of the thin film 110 by using the dispenser 190 so as to form an underfill 196 therebetween, as shown in FIG. 12B (a regular view).

The lid bonding step 184:

As shown in FIG. 12B, the wiring substrate 51 is re-overturned into a posture in which the LSI chip 60 is on the upside. Then, an Ag paste 194 is placed on the upper surface of the LSI chip 60, and a bonding sheet 195 having a shape of a square frame (as viewed from above) and a size corresponding to the lid 80 is placed on the upper surface 92 of the rigid substrate 90. Subsequently, the lid 80 is mounted on the upper surface of the wiring substrate 51, and is heated and pressed. Thereby, as shown in FIG. 12C (an overturned view), a peripheral portion of the lid 80 is bonded to the wiring substrate 51, and a projecting portion 80a at the center of the lid 80 is joined to the upper surface of the LSI chip 60. The LSI chip 60 and the chip capacitors 70 to 73 are sealed with the lid 80.

The BGA-ball mounting step 185:

As shown in FIG. 12C, the wiring substrate 51 is overturned (upside down) again. Then, BGA balls 132 are mounted on electrode pads 99a formed on the undersurface of the rigid substrate 90 of the wiring substrate 51, and are melted by heating so as to form the BGA 132a with an approximately 800-μm pitch, as shown in FIG. 12D.

Figure 12D:
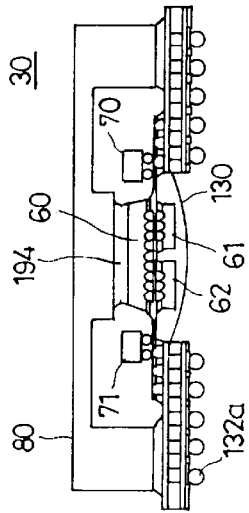
Figure 12C:
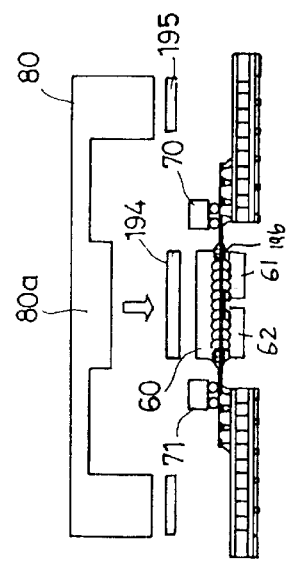
Figure 12E:
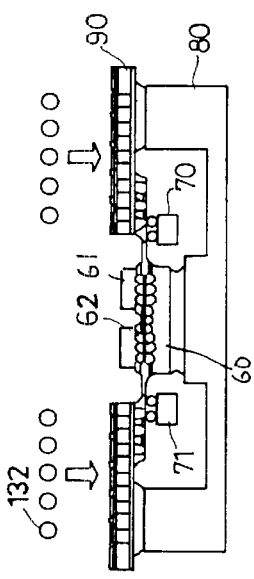

The resin potting step 186:

As shown in FIG. 12D, a resin is potted into the space 91a by using a dispenser 197 so as to form the sealing resin 130 that seals the LSI chips 61 and 62, as shown in FIG. 12E (a regular view).

The above-described steps complete the multichip module 50.

Next, a description will be given of features of the multichip module 50.

The multichip module 50 has the following features.

(1) Since the opening 91 is formed at the center of the rigid substrate 90, the LSI chips (61 and 62) can be mounted on the under surface 112 of the thin film 110. Thus, the multichip module 50 has the LSI chips 60 to 62 mounted on both the upper and under surfaces 111 and 112 of the thin film 110. Therefore, the multichip module 50 has a larger number of the LSI chips (60 to 62) than the multichip module 40 shown in FIG. 2. That is, the LSI chips (60 to 62) are mounted more densely on the wiring substrate 51.

(2) Since the opening 91 is formed at the center of the rigid substrate 90, the LSI chips 61 and 62 mounted on the under surface 112 of the thin film 110 become accessible. Therefore, when the LSI chips 61 and 62 do not operate normally, the LSI chips 61 and 62 can be exchanged. In other words, the LSI chips 61 and 62 mounted on the under surface 112 of the thin film 110 can be reworked.

(3) The LSI chip 60 mounted on the upper surface 111 of the thin film 110 and each of the LSI chips 61 and 62 mounted on the under surface 112 of the thin film 110 are electrically connected to each other by way of a via-hole connection 127 alone without a wiring pattern, as shown in FIG. 5. Accordingly, a signal transmission path between the LSI chip 60 and each of the LSI chips 61 and 62 is as extremely short as the thickness t1 of 50–60 μm of the thin film 110. Thereby, a signal transmitted between the LSI chip 60 and each of the LSI chips 61 and 62 is less delayed by impedance, inductance and other factors. This enables operating frequencies of the LSI chips 60 to 62 to be increased to the order of GHz so as to realize a high-speed operation.

In some cases, in order to lower the cost, two small-sized LSI chips, formed for example by dividing a large-sized LSI chip, are used in place of one large-sized LSI chip. When two small-sized LSI chips are arranged side by side, a signal transmission path between the two adjacent LSI chips becomes long corresponding to a wiring pattern on a wiring substrate. Accordingly, in consideration of delay of a signal, operating frequencies of the LSI chips need to be restricted low. However, the present embodiment, in which the LSI chips 60 to 62 are mounted on the upper and under surfaces 111 and 112 of the thin film 110, solves the problem of delay of a signal caused in the case of dividing one large-sized LSI chip into two small-sized LSI chips.

(4) The LSI chip 60 producing a large amount of heat is mounted on the upper surface 111 of the thin film 110. Therefore, heat generated by the LSI chip 60 is conducted to the lid 80, is spread throughout the lid 80, and is emitted from the surface of the lid 80 into the air. Thus, the LSI chip 60 producing a large amount of heat is effectively cooled.

[Embodiment 2]

Figure 13:
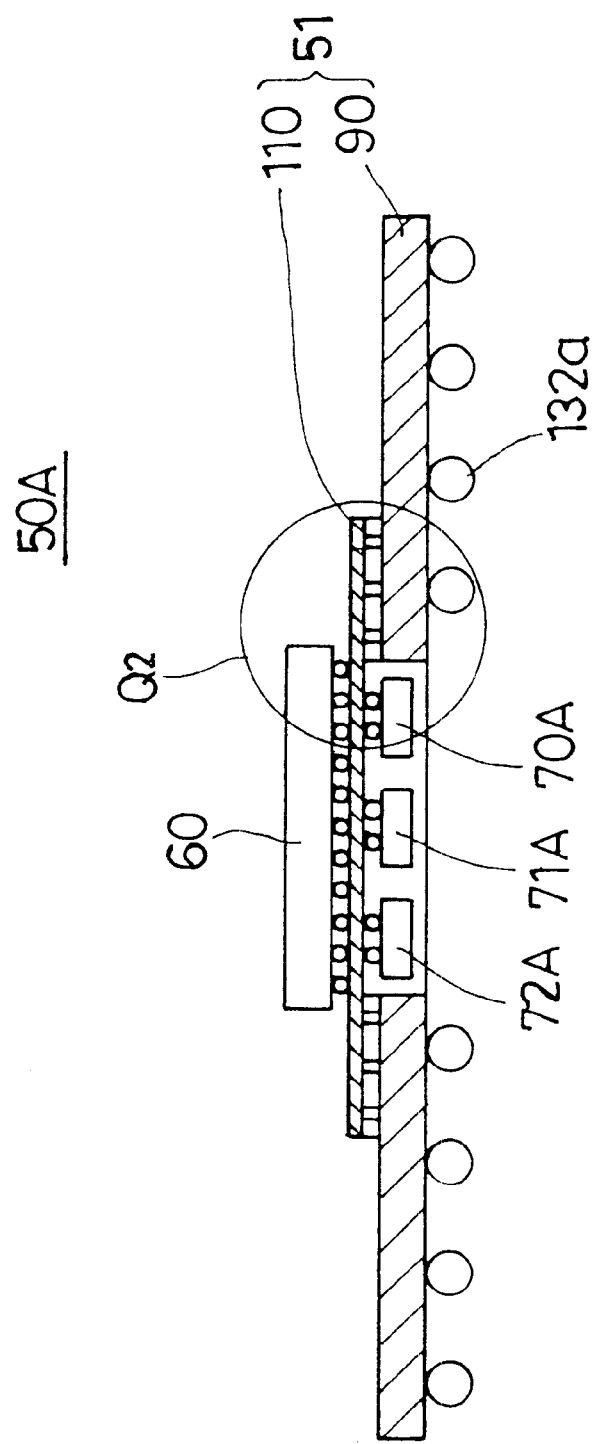
FIG. 13 is a cross-sectional view of a multichip module according to a second embodiment of the present invention.
Figure 14:
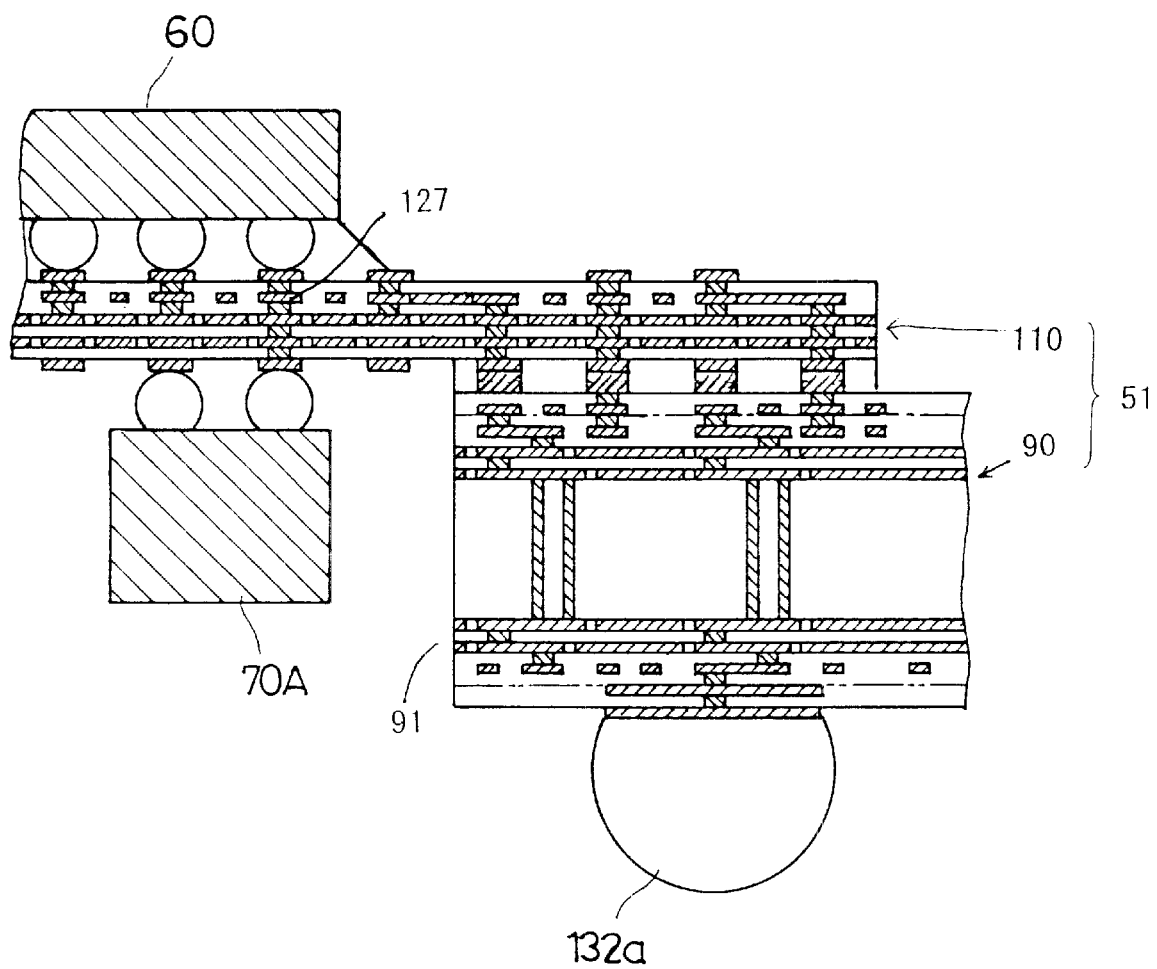
FIG. 14 is a magnified view of a part encircled by a circle Q2 in FIG. 13.

FIG. 13 is a cross-sectional view of a multichip module 50A according to a second embodiment of the present invention. FIG. 14 is a magnified view of a part encircled by a circle Q2 in FIG. 13.

The multichip module 50A comprises the LSI chip 60 mounted on the upper surface of the thin film 110, and chip capacitors 70A, 71A and 73A as bypass capacitors mounted on the under surface of the thin film 110.

Therefore, as also shown in FIG. 14, the distance between each of the chip capacitors 70A, 71A and 73A and the LSI chip 60 becomes as extremely short as the thickness of 50–60 μm of the thin film 110. Accordingly, inductance between each of the chip capacitors 70A, 71A and 73A and the LSI chip 60 becomes small so as to make a full use of capacitances of the chip capacitors 70A, 71A and 73A; this enables elimination of high-frequency noises.

[Embodiment 3]

Figure 15:
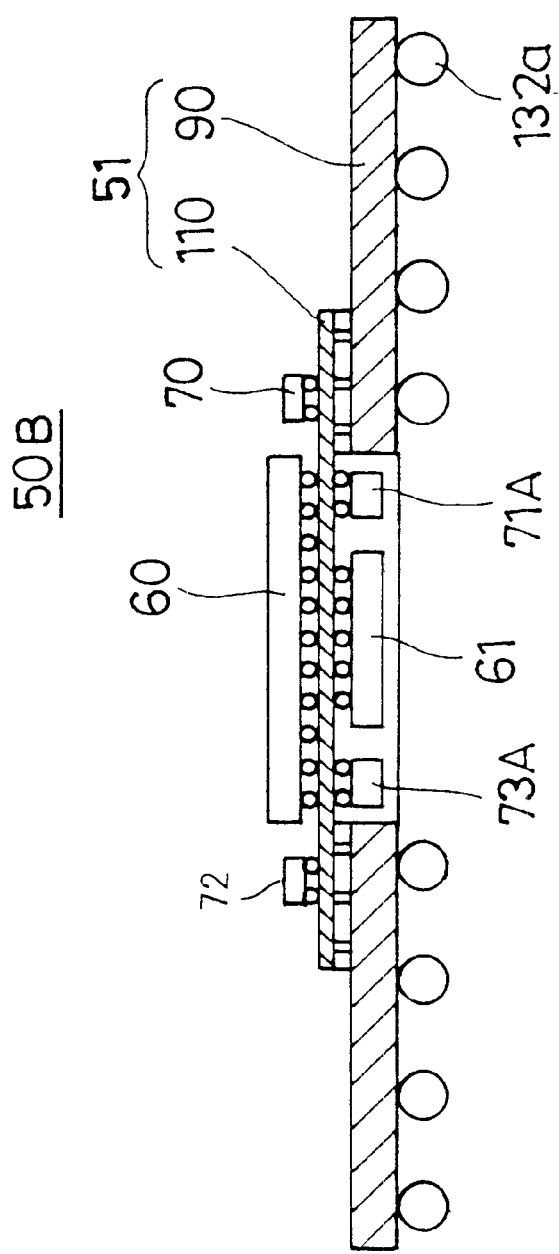
FIG. 15 is a cross-sectional view of a multichip module according to a third embodiment of the present invention.

FIG. 15 is a cross-sectional view of a multichip module 50B according to a third embodiment of the present invention.

The multichip module 50B comprises the LSI chip 60 and the chip capacitors 70 and 72 as bypass capacitors mounted on the upper surface of the thin film 110, and the LSI chip 61 and the chip capacitors 71A and 73A as bypass capacitors mounted on the under surface of the thin film 110.

It is noted that, in the above-described embodiments, the thin film 110 bonded to the rigid substrate 90 having the opening 91 is not limited to the above-described structure, but may have a structure comprising an insulating film as a base, via holes formed in this insulating film, and wiring patters formed on the upper and under surfaces of this insulating film.

It is also noted that a "multichip module" includes a single-chip module having a single chip.

The present invention is not limited to the specifically disclosed embodiments, and variations and modifications may be made without departing from the scope of the present invention.

The present application is based on Japanese priority application No. 2001-116022 filed on Apr. 13, 2001, the entire contents of which are hereby incorporated by reference.

What is claimed is:

1. A multichip module comprising:

a rigid substrate including a core material and having an opening;

a thin film fixed on an upper surface of said rigid substrate so as to be electrically connected to said rigid substrate and to close said opening, the thin film having an upper chip mounting part on an upper surface thereof and an under chip mounting part on an under surface thereof;

a first chip mounted on said upper chip mounting part; and a second chip mounted on said under chip mounting part so as to be located in said opening, wherein said rigid substrate and said thin film form a wiring substrate having a composite structure.

2. The multichip module as claimed in claim 1, wherein said thin film comprises a first electrode pad formed on said upper chip mounting part, a second electrode pad formed on said under chip mounting part, and a via hole connecting said first electrode pad and said second electrode pad.

3. The multichip module as claimed in claim 1, further comprising:

a lid joined to the upper surface of said rigid substrate so that said lid contacts and covers said first chip; and a sealing member covering said second chip located in said opening.

4. The multichip module as claimed in claim 1, wherein said first chip produces a larger amount of heat than said second chip.

5. A printed board unit comprising:

a printed board; and a multichip module mounted on said printed board via at least one bump, the multichip module including:

a rigid substrate including a core material and having an opening, said bump being formed on an under surface of the rigid substrate;

a thin film fixed on an upper surface of said rigid substrate so as to be electrically connected to said rigid substrate and to close said opening, the thin film having an upper chip mounting part on an upper surface thereof and an under chip mounting part on an under surface thereof;

a first chip mounted on said upper chip mounting part; and a second chip mounted on said under chip mounting part so as to be located in said opening, wherein said rigid substrate and said thin film form a wiring substrate having a composite structure.

6. A wiring substrate comprising:

a rigid substrate including a core material and having an opening; and a thin film fixed on an upper surface of said rigid substrate so as to be electrically connected to said rigid substrate and to close said opening, the thin film having an upper chip mounting part on an upper surface thereof and an under chip mounting part on an under surface thereof, wherein said rigid substrate and said thin film form a composite structure.

7. A method of manufacturing a wiring substrate having a composite structure composed of a rigid substrate including a core material and having an opening, and a thin film fixed on an upper surface of said rigid substrate so as to be electrically connected to said rigid substrate and to close said opening, the thin film having an upper chip mounting part on an upper surface thereof and an under chip mounting part on an under surface thereof, the method comprising the steps of:

preparing a stage having a raised portion corresponding to said opening;

setting said rigid substrate on said stage by inserting said raised portion into said opening;

placing said thin film on said rigid substrate and an upper surface of said raised portion so that said thin film covers said opening; and joining said thin film to said rigid substrate.

\* \* \* \* \*